(12) United States Patent
Park et al.

(10) Patent No.: US 11,195,886 B2
(45) Date of Patent: Dec. 7, 2021

(54) ORGANIC LIGHT EMITTING DIODE AND THREE-DIMENSIONAL TACTILE DISPLAY APPARATUS USING STRETCHABLE LIGHT-EMITTING MATERIAL AND MANUFACTURING METHOD THEREOF

(71) Applicant: INDUSTRY-ACADEMIC COOPERATION FOUNDATION YONSEI UNIVERSITY, Seoul (KR)

(72) Inventors: Jin Woo Park, Seoul (KR); Jin Hoon Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 16/781,144

(22) Filed: Feb. 4, 2020

(65) Prior Publication Data

US 2021/0043700 A1    Feb. 11, 2021

(30) Foreign Application Priority Data

Aug. 5, 2019    (KR) ........................ 10-2019-0095049

(51) Int. Cl.
*H01L 29/08* (2006.01)
*H01L 27/32* (2006.01)
(Continued)

(52) U.S. Cl.
CPC ...... *H01L 27/3225* (2013.01); *H01L 51/0097* (2013.01); *H01L 51/5012* (2013.01);
(Continued)

(58) Field of Classification Search
CPC ............ H01L 51/0097; H01L 51/5012; H01L 51/5056; H01L 51/0072
See application file for complete search history.

(56) References Cited

U.S. PATENT DOCUMENTS

2013/0099224 A1*  4/2013  Iijima ................. H01L 51/0039
                                                           257/40
2018/0166642 A1*  6/2018  Xie ....................... H01L 51/502
(Continued)

FOREIGN PATENT DOCUMENTS

JP    2008217787 A    9/2008
KR   20140140742 A   12/2014
(Continued)

OTHER PUBLICATIONS

Korean Office Action for Application No. 10-2019-0095049, dated Nov. 22, 2019.

*Primary Examiner* — Phuc T Dang
(74) *Attorney, Agent, or Firm* — Nixon Peabody LLP; Thomas P. Pavelko

(57) ABSTRACT

Provided are an organic light emitting diode (OLED), a three-dimensional (3D) tactile display apparatus, and a manufacturing method thereof. The OLED includes a stretchable driving part including a stretchable field effect transistor (FET) and a stretchable light emitting part including a stretchable material on the stretchable driving part. The 3D tactile display apparatus includes a stretchable actuator having a driving layer formed of transparent rubber, a stretchable driving part having a stretchable FET, and a stretchable light emitting part including a stretchable material.

16 Claims, 7 Drawing Sheets

(51) Int. Cl.
  *H01L 51/00*  (2006.01)
  *H01L 51/50*  (2006.01)
  *H01L 51/52*  (2006.01)
  *H01L 51/56*  (2006.01)

(52) U.S. Cl.
  CPC ...... *H01L 51/5056* (2013.01); *H01L 51/5072* (2013.01); *H01L 51/5221* (2013.01); *H01L 51/56* (2013.01)

(56) References Cited

U.S. PATENT DOCUMENTS

| | | | |
|---|---|---|---|
| 2018/0267640 A1 | 9/2018 | Virgin et al. | |
| 2018/0366680 A1* | 12/2018 | Okigawa | H01L 27/3276 |
| 2019/0346883 A1* | 11/2019 | Kim | G06F 1/1641 |
| 2020/0411621 A1* | 12/2020 | Tsukamoto | H01L 27/3232 |

FOREIGN PATENT DOCUMENTS

| | | |
|---|---|---|
| KR | 20160040048 A | 4/2016 |
| KR | 10-1912036 B1 | 10/2018 |

* cited by examiner

110

510

ORGANIC LIGHT EMITTING DIODE AND THREE-DIMENSIONAL TACTILE DISPLAY APPARATUS USING STRETCHABLE LIGHT-EMITTING MATERIAL AND MANUFACTURING METHOD THEREOF

CROSS-REFERENCE TO RELATED APPLICATIONS

This application claims priority under 35 U.S.C. § 119 to Korean Patent Application No. 10-2019-0095049, filed on Aug. 5, 2019, in the Korean Intellectual Property Office, the disclosure of which is incorporated herein by reference in its entirety.

TECHNICAL FIELD

The following disclosure relates to an organic light emitting diode (OLED), a three-dimensional tactile display apparatus, and a manufacturing method thereof, and in particular, to a technical idea of realizing an OLED and a three-dimensional tactile display apparatus using a stretchable light-emitting material.

BACKGROUND

Currently, light emitting devices (or electroluminescent devices) applied to stretchable displays are manufactured through structure control.

Specifically, the light emitting devices are manufactured through an "island interconnect" method of using devices manufactured on a rigid substrate in the same manner, lowering the density of the devices, and forming a serpentine interconnection between the devices and a "mechanical buckling" method of transferring manufactured devices to a pre-strained substrate and removing strain to generate buckling to assign stretch to the devices.

The two methods described above are advantageous in that stretch may be assigned to the existing devices, while the devices are used as is, but, in the case of the "island interconnect" method, the density of the devices is lowered and the process is quite complicated, and in the case of the "mechanical buckling" method, transferring makes it difficult to secure a large area and the devices may be stretchable in a direction in which pre-strain is applied but are rarely stretchable in a direction perpendicular to the direction, resulting in a disadvantage in that stretch cannot be assigned in various directions.

Meanwhile, in order to solve the aforementioned disadvantages, a method of forming Ag nano-wire-based cathode and anode on a transparent polyurethane substrate has been proposed. This method, however, has a very high driving voltage and does not consider stretch regarding a hole transport layer, an emission layer, and an electron transport layer, which, thus, makes it difficult to apply to the manufacturing of stretchable OLEDs and three-dimensional tactile displays.

RELATED ART DOCUMENT

Patent Document

Korean Patent Laid-open Publication No. 10-1912036, entitled "Transparent electrode and manufacturing method thereof"

SUMMARY

An exemplary embodiment of the present disclosure is directed to providing a three-dimensional (3D) tactile display apparatus including a stretchable light emitting part in which a hole transport layer, an emission layer, an electron transport layer, and a cathode (i.e., a positive electrode) are all formed of a stretchable material, thereby realizing surface texture and a 3D stereoscopic image through stretchable characteristics, and a manufacturing method thereof.

Another exemplary embodiment of the present disclosure is directed to providing a 3D tactile display apparatus enabling a solution process and allowing a large area at a low voltage, and a manufacturing method thereof.

Another exemplary embodiment of the present disclosure is directed to providing an organic light emitting diode (OLED) including a stretchable light emitting part in which a hole transport layer, an emission layer, an electron transport layer, and a cathode are all formed of a stretchable material, thereby realizing a stretchable image.

In one general aspect, a three-dimensional (3D) tactile display apparatus includes a stretchable actuator including a driving layer formed of transparent rubber, a stretchable driving part including a stretchable field effect transistor (FET) on the stretchable actuator, and a stretchable light emitting part including a stretchable material on the stretchable driving part.

The stretchable light emitting part may include a stretchable hole transport layer (HTL) including a conductive polymer material, a stretchable emission layer (EML) formed on the stretchable HTL and including a light-emitting material, a stretchable electron transport layer (ETL) formed on the stretchable EML and including metal oxide nano particles, and a stretchable cathode formed on the stretchable ETL and including a nano-wire material.

The stretchable HTL may include a nonionic surfactant and a conductive polymer nano-fiber. The conductive polymer nano-fiber may be a conductive polymer material having a nano-fiber structure formed by adding a nonionic surfactant having a predetermined mass ratio to a solution containing the conductive polymer material.

The stretchable EML may include one or a combination of two selected from the group consisting of a stretchable polymer material and a plasticizer and a light-emitting material.

The light-emitting material may include one or two or more selected from the group consisting of a fluorescent polymer, a fluorescent compound, a phosphorescent polymer, and a phosphorescent compound, the stretchable polymer material may include one or two or more selected from the group consisting of polybutadiene-based rubber, silicone-based rubber, and polyethylene oxide-based rubber, and the plasticizer may be a nonionic surfactant.

The stretchable ETL may include n-type semiconductor metal oxide nano particle and an amine-based polymer material doped with an n-type dopant.

The stretchable driving part may include the stretchable FET, a stretchable bit-line, and a stretchable anode (i.e., a stretchable negative electrode) and control an ON/OFF operation of each pixel of the stretchable light emitting part.

The stretchable actuator may further include a pneumatic chamber and a micro-channel formed in the driving layer to control 3D deformation of a shape of the stretchable light emitting part.

In another general aspect, a method of manufacturing a three-dimensional (3D) tactile display apparatus includes forming a stretchable actuator including a driving layer of transparent rubber, forming a stretchable driving part including a stretchable field effect transistor (FET) on the stretchable actuator, and forming a stretchable light emitting part including a stretchable material on the stretchable driving part.

The forming of the stretchable light emitting part may include forming a stretchable hole transport layer (HTL) including a conductive polymer material, forming a stretchable emission layer (EML) including a light-emitting material on the stretchable HTL, forming a stretchable electron transport layer (ETL) including metal oxide nano particles on the stretchable EML, and forming a stretchable cathode including a nano-wire material on the stretchable ETL.

The forming of the stretchable HTL may include changing a structure of the conductive polymer material into a nano-fiber structure by adding a non-ionic surfactant having a predetermined mass ratio to a solution containing the conductive polymer material.

The forming of the stretchable EML may include forming the stretchable EML by mixing one or two materials selected from the group consisting of a stretchable polymer material and a plasticizer with the light-emitting material.

The forming of the stretchable ETL may include forming the stretchable ETL by mixing n-type semiconductor metal oxide nano particles with an amine-based polymer material doped with an n-type dopant.

The forming of the stretchable actuator may include forming a pneumatic chamber and a micro-channel and forming the driving layer on the pneumatic chamber and the micro-channel.

In another general aspect, a stretchable organic light emitting diode (OLED) includes a stretchable driving part including a stretchable field effect transistor (FET), and a stretchable light emitting part including a stretchable material on the stretchable driving part.

The stretchable light emitting part may include a stretchable hole transport layer (HTL) including a conductive polymer material, a stretchable emission layer (EML) formed on the stretchable HTL and including a light-emitting material, a stretchable electron transport layer (ETL) formed on the stretchable EML and including metal oxide nano particles, and a stretchable cathode formed on the stretchable ETL and including a nano-wire material.

The stretchable HTL may include a nonionic surfactant and a conductive polymer nano-fiber.

The stretchable EML may include one or a combination of two selected from the group consisting of a stretchable polymer material and a plasticizer and a light-emitting material.

Other features and aspects will be apparent from the following detailed description, the drawings, and the claims.

DETAILED DESCRIPTION OF EXEMPLARY EMBODIMENTS

Figure 1:
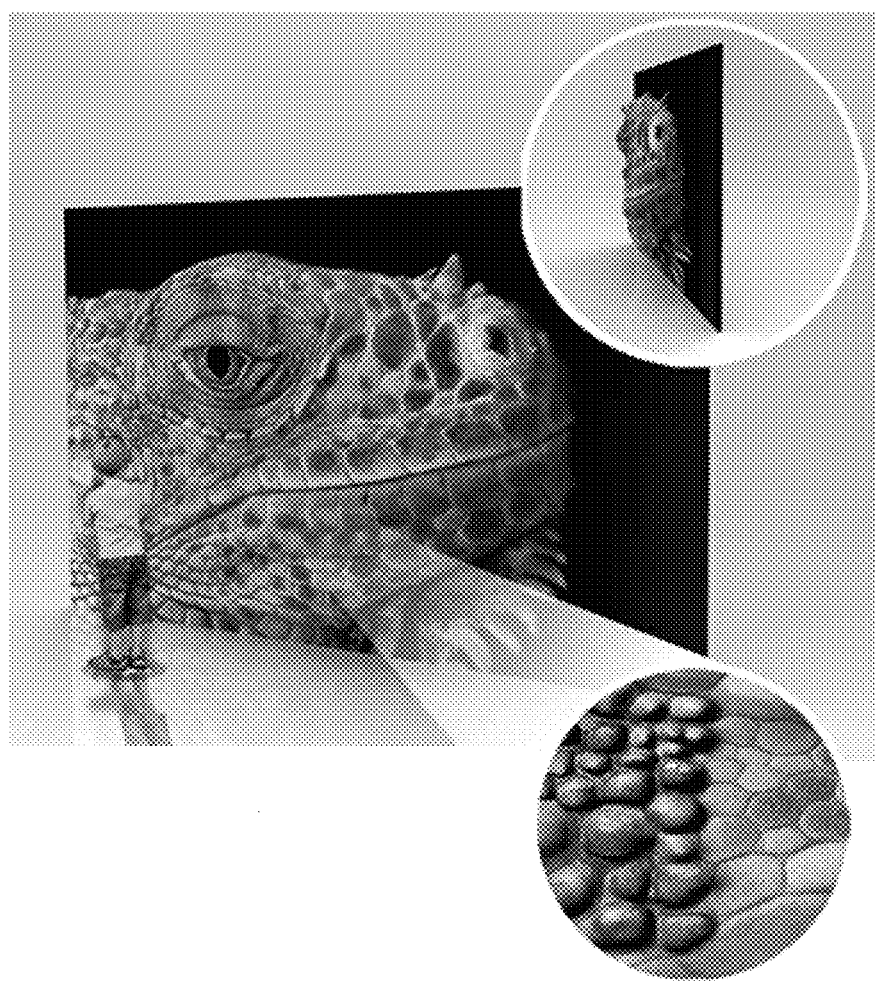
FIGS. 1 and 2 are views illustrating a three-dimensional (3D) tactile display apparatus according to an exemplary embodiment.

Hereinafter, various exemplary embodiments will be described in detail with reference to the accompanying drawings.

Exemplary embodiments and terms used herein are not intended to limit the technologies described in the present disclosure to specific exemplary embodiments, and it should be understood that the exemplary embodiments and the terms include modifications on, equivalents of, and/or alternatives of the corresponding exemplary embodiments described herein.

In the following description, when a detailed description of the relevant known function or configuration is determined to unnecessarily obscure the gist of the present disclosure, the detailed description will be omitted.

The terms used henceforth are defined in consideration of the functions of the present disclosure, and may be altered according to the intent of a user or operator, or conventional practice. Therefore, the terms should be defined on the basis of the entire content of this specification.

With regard to the description of drawings, similar components may be marked by similar reference numerals.

The terms of a singular form may include plural forms unless otherwise specified.

In the disclosure, the expressions "A or B", "at least one of A and/or B", and the like used herein may include any and all combinations of one or more of the associated listed items.

Expressions such as "first," or "second," and the like, may express their components regardless of their priority or importance and may be used to distinguish one component from another component but is not limited to these components.

When a certain (e.g., first) element is referred to as being "(operatively or communicatively) coupled with/to" or "connected to" another (e.g., second) element, it may be directly coupled with/to or connected to the other element or an intervening element (e.g., a third element) may be present.

According to the situation, the expression "configured to" used herein may be interchangeably used as, for example, the expression "suitable for", "having the capacity to", "designed to", "adapted to", "made to", or "capable of".

In a certain context, the expression "a device configured to" may mean that the device is "capable of" operating together with another device or other parts.

For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

In the above-described detailed exemplary embodiments of the present disclosure, a component included in the present disclosure is expressed in the singular form or the plural form according to the details of the presented exemplary embodiment.

However, the singular or plural expressions are selected to be suitable for proposed situations for convenience of description, and the present disclosure is not limited to the singular or plural elements. An element expressed in a plural form may be configured as a singular element, or an element expressed in a singular form may be configured in a plural form.

Although an exemplary embodiment has been described in the detailed description of the present disclosure, the present disclosure may be modified in various forms without departing from the scope of the present disclosure.

Therefore, the scope of the present disclosure should not be defined as being limited to the exemplary embodiments, but should be defined by the appended claims and equivalents thereof.

A first aspect of the present disclosure relates to a three-dimensional (3D) tactile display apparatus including a stretchable actuator including a driving layer of transparent rubber, a stretchable driving part including a stretchable field effect transistor (FET) on the stretchable actuator, and a stretchable material on the stretchable driving part.

Figure 2:
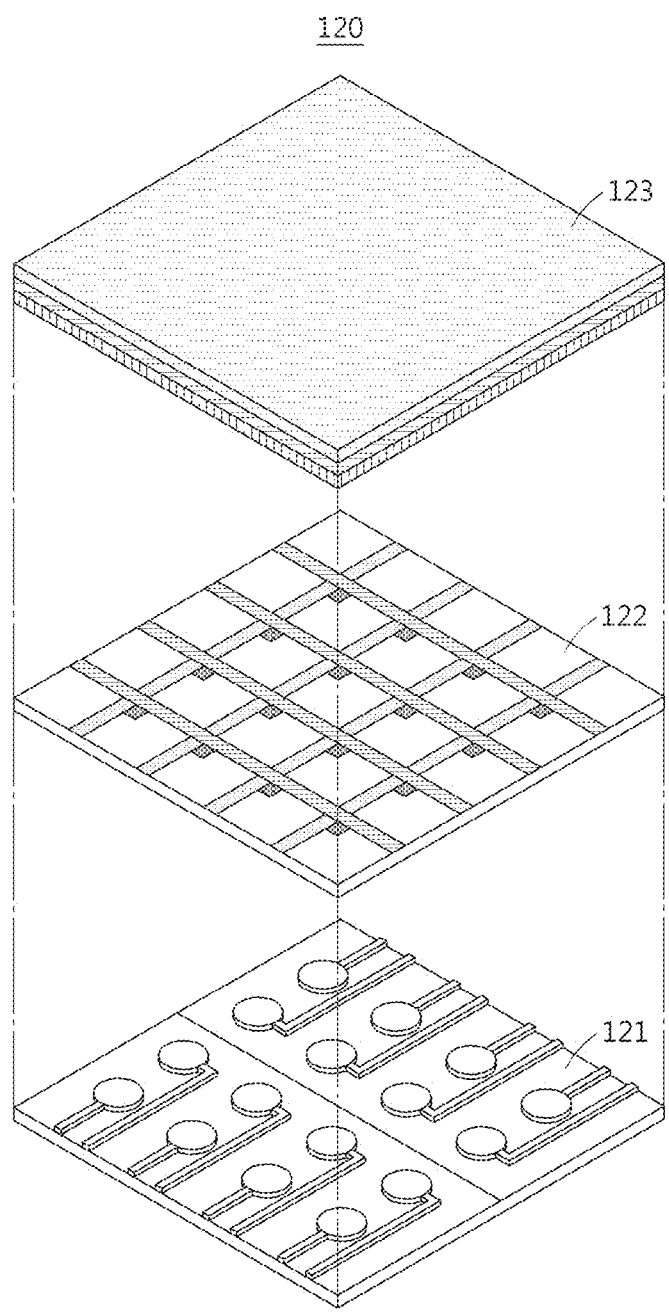

FIGS. 1 to 2 are views illustrating a 3D tactile display apparatus according to an exemplary embodiment.

Referring to FIGS. 1 and 2, reference numeral 110 denotes a 3D tactile display apparatus according to an exemplary embodiment, and reference numeral 120 denotes a specific configuration of the 3D tactile display apparatus according to an exemplary embodiment.

According to reference numeral 110, the 3D tactile display apparatus according to an exemplary embodiment has a display deformed to 3D to represent surface texture or provide a 3D stereoscopic image.

Specifically, the 3D tactile display apparatus may be designed such that the display is combined with a soft actuator and a surface texture and a 3D stereoscopic image are realized through mechanical deformation of the soft actuator.

According to reference numeral 120, the 3D tactile display apparatus includes a stretchable actuator 121 realizing a display having a 3D effect by expanding the display tridimensionally through injection of air pressure, a stretchable driving part 122 controlling ON/OFF of the display to perform a function as a display, and a stretchable light emitting part 123.

For example, the stretchable light emitting part 123 may include at least one display device in which a hole transport layer, an emission layer, an electron transport layer, and a cathode are sequentially stacked.

Preferably, the display device may be an organic light emitting diode (OLED).

According to an exemplary embodiment, in the 3D tactile display apparatus, the stretchable actuator 121, the stretchable driving part 122, and the stretchable light emitting part 123 may all formed of a stretchable material to realize deformation in a 3D direction (x axis, y axis, and z axis), rather than one axis direction (x axis and y axis).

Specifically, in the stretchable light emitting part 123, the hole transport layer, the emission layer, the electron transport layer, and the anode may be formed of a stretchable material.

In addition, the stretchable actuator 121 according to an exemplary embodiment may include a driving layer formed of transparent rubber. Specifically, the transparent rubber may be a combination of one or two or more selected from the group consisting of silicone-based rubber, isoprene-based rubber, styrene-butadiene-styrene block copolymer rubber, styrene-ethylene-butadiene-styrene-based block copolymer rubber, polyurethane-based rubber and poly-olefin-based rubber, and preferably, a silicone-based rubber, and may be, for example, polydimethylsiloxane (PDMS)-based rubber.

According to an exemplary embodiment, the stretchable actuator 121 may further include a pneumatic chamber and a micro-channel formed in the driving layer.

More specifically, for example, the stretchable actuator 121 may include at least one pneumatic chamber and micro-channel and may realize a 3D effect by injecting air pressure using the pneumatic chamber.

A specific structure of the stretchable actuator 121 according to an exemplary embodiment will be described in detail later with reference to FIG. 5.

The stretchable driving part 122 according to an exemplary embodiment may be formed on the stretchable actuator 121 and may include a stretchable field effect transistor (FET).

For example, the stretchable driving part 122 may control an ON/OFF operation of the 3D tactile display apparatus using a switch unit made of a thin film transistor (TFT).

According to an exemplary embodiment, the stretchable FET may be formed of at least one material of carbon nano-tube (CNT) and nano-wire.

A specific configuration of the stretchable driving part 122 according to an exemplary embodiment will be described in more detail later with reference to FIG. 4.

The stretchable light emitting part 123 according to an exemplary embodiment may be formed of a stretchable material on the stretchable driving part 122.

For example, the stretchable light emitting part 123 may include a hole transport layer, an emission layer, an electron transport layer, and an anode each formed of a stretchable material.

A specific configuration of the stretchable light emitting part 123 according to an exemplary embodiment will be described in more detail with reference to FIG. 3.

Figure 3:
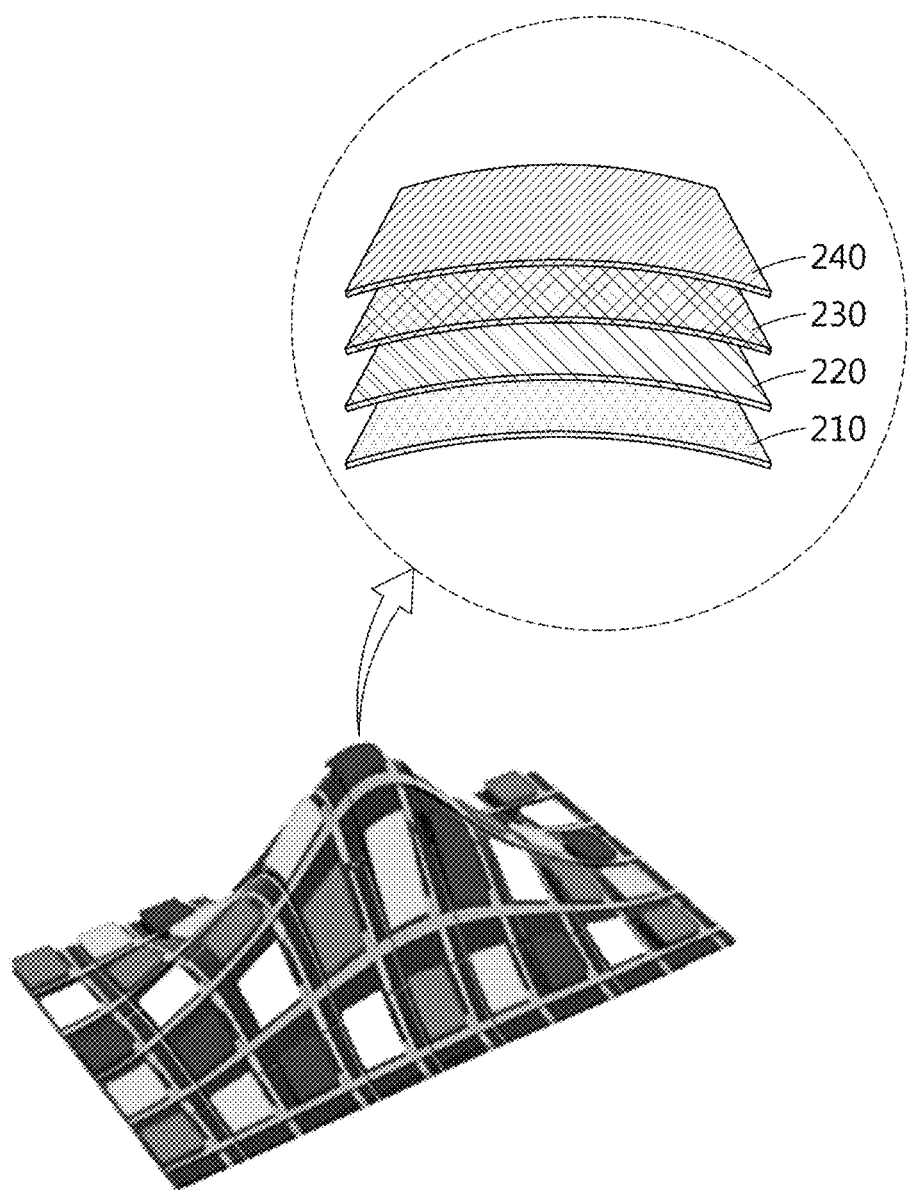
FIG. 3 is a view illustrating an example of the stretchable light emitting part according to an exemplary embodiment.

FIG. 3 is a view illustrating an example of the stretchable light emitting part according to an exemplary embodiment.

Referring to FIG. 3, a stretchable light emitting part 200 according to an exemplary embodiment may include a stretchable hole transport layer (HTL) 210, a stretchable emission layer (EML) 220, a stretchable electron transport layer (ETL) 230, and a stretchable cathode 240.

In other words, the stretchable light emitting part 200 according to an exemplary embodiment may include at least one display device in which the stretchable HTL 210, the stretchable EML 220, the stretchable ETL 230, and the stretchable cathode 240 are sequentially stacked.

Preferably, the display device may be an organic light emitting diode (OLED).

According to an exemplary embodiment, the stretchable HTL 210 may include a conductive polymer material. Specifically, the stretchable HTL 210 may include a nonionic surfactant and a conductive polymer nano-fiber. The conductive polymer nano-fiber may be formed by adding a nonionic surfactant to a solution containing a conductive polymer material. More specifically, a solution is prepared by mixing a solvent and a conductive polymer material, and a nonionic surfactant having a predetermined optimal mass ratio is added to the mixture so that the conductive polymer material is phase-separated and self-assembled in the solution and a conductive polymer forms a structure of the nano-fiber.

Specifically, the conductive polymer nano-fiber may be formed by mixing a solvent and a conductive polymer material to prepare a polymer solution, adding a nonionic surfactant to the polymer solution to prepare a mixed solution, stirring the mixed solution at 100 to 1000 rpm for 2 to 10 hours, spin-coating the stirred mixed solution to prepare a thin film, and heat-treating the thin film at a high temperature.

The stirring may be performed, preferably, at 300 to 500 rpm for 4 to 8 hours, and under these conditions, the nano-fiber may be formed more uniformly in the solution. Without limitation, removing large particles from the stirred mixed solution may be further provided before performing spin-coating.

The heat-treating of the thin film at a high temperature may be heat-treating for 5 to 20 minutes at a temperature of 80 to 130° C., but is not limited thereto.

The conductive polymer nano-fiber is a fibrous polymer having a very high aspect ratio, and is produced in a large number in the solution by the nonionic surfactant. A plurality of conductive polymer nano-fibers may be in electrical contact with each other in a mesh structure, and the nano-fibers in the mesh structure may exhibit high stretch when strain is applied and may have high mechanical stability and stable hole transport properties as the mesh structure maintains sufficient electrical contact even at the high strain.

A weight percent (wt %) of the conductive polymer nano-fibers and the nonionic surfactant may be 1:1 to 1:20, specifically, 1:2 to 1:10, and more specifically, 1:3 to 1:6.

In order to form the conductive nano-fibers, a concentration of the conductive polymer material in the solution containing the conductive polymer material may be 0.1 to 10 wt %, specifically 0.5 to 5 w %, and more specifically 1.3 to 1.7 wt %.

An average diameter of the conductive polymer nano-fibers may be 1 to 200 nm, specifically, 5 to 100 nm, and more specifically 10 to 30 nm, and an aspect ratio may be 5 or greater, and specifically, 10 or greater.

Without limitation, the conductive polymer material may be a positively or negatively charged ionic conductive polymer, and more specifically, may be a mixture of a cationic conductive polymer and an anionic conductive polymer. A specific example of the conductive polymer material may be poly(3,4-ethylenedioxythiophene:polystyrene sulfonate (PEDOT:PSS), and a mass ratio of PEDOT and PSS is 1:1 to 1:20, specifically 1:2 to 1:10, and more specifically, 1:4 to 1:8.

The nonionic surfactant may be preferably a polyethylene oxide (PEO)-based nonionic surfactant with an ethylene oxide structural unit added thereto, and a specific example thereof may be Triton X-100. As the PEO-based nonionic surfactant is mixed, the conductive polymer material may be effectively phase-separated and self-assembled in the solution to form a conductive polymer having a structure of nano-fibers.

In general, PEDOT:PSS has flexible properties but is known to be mechanically broken when a strain equal to or higher than a threshold is applied thereto, having a limitation in flexibility.

However, in an exemplary embodiment according to the present disclosure, the structure of the PEDOT:PSS is changed into the nano-fiber form through the method described above, thereby significantly improving the mechanical stretch of the PEDOT:PSS material. Since the PEDOT:PSS conductive nano-fibers are formed in the stretchable HTL 210, even if strain is applied, the high stretch of the PEDOT:PSS nano-fibers does not substantially cause deterioration of the hole transport characteristics, and thus, the function of the stretchable hole transport layer 210 may be stably performed.

Meanwhile, the stretchable HTL 210 may be formed by spin-coating the solution containing the conductive polymer material on the stretchable anode provided in the stretchable driving part described above with reference to FIGS. 1 and 2.

For example, specifically, the PEDOT:PSS may be changed into a nano-fiber structure by adding Triton X-100, which is a nonionic surfactant, to an aqueous PEDOT:PSS solution. A weight percent of the PEDOT:PSS and the nonionic surfactant in the aqueous solution may be 1:1 to 1:20, specifically 1:2 to 1:10, and more specifically 1:3 to 1:6.

For example, preferably, in order to form the stretchable HTL 210, a water-alcohol co-solvent further containing alcohol may be used to dilute the concentration of the PEDOT:PSS solution and lower viscosity. The weight percent of water and alcohol included in the cosolvent may be 1:2 to 2:1. For example, the alcohol may be a mixture of ethyl alcohol (ethanol) and isopropyl alcohol, and ethyl alcohol and isopropyl alcohol may be mixed in a mass ratio of 1:10 to 10:1, and may be added in a mass ratio of, more specifically, 2:1 to 1:2 to prepare the alcohol. Spin-coating may be performed at 500 to 2000 rpm but is not limited thereto.

In addition, heat treatment may be performed for 10 to 30 minutes at a temperature of 90 to 130° C. to remove a residual solvent after spin-coating to form the stretchable HTL 210.

According to an exemplary embodiment, the stretchable EML 220 may be formed on the stretchable HTL 210 and include a light-emitting material.

The stretchable EML 220 may be formed through at least one of a polymer blending method and a plasticizer adding method. Accordingly, the stretchable EML 220 may include one selected from the group consisting of a stretchable polymer material and a plasticizer or a combination thereof and a light-emitting material.

The light-emitting material may include one or two or more selected from the group consisting of a fluorescent polymer, a fluorescent compound, a phosphorescent polymer, and a phosphorescent compound.

The fluorescent polymer may include one or two or more selected from the group consisting of polythiophene-based polymer, polyphenylene-based polymer, poly-p-phenylenevinylene-based polymer, polyfluorene-based polymer, and polyarylenevinylene-based polymer. More specifically, the fluorescent polymer may be, for example, polyparaphenylene vinylene (MEH-PPV), poly (9,9-dioctyl-fluorene) (PFO), PDY-132, and the like.

The fluorescent compound may include Alq3, DCJTB (4-(Dicyanomethylene)-2-tert-butyl-6-(1,1,7,7-tetramethyljulolidin-4-yl-vinyl)-4H-pyran, 4-(dicyanomethylene)-2-tert-butyl-6-(1,1,7,7-tetramethyljulolidin-4-yl-vinyl)-4H-pyran), DBP (tetraphenyldibenzoperiflanthene), and the like.

The phosphorescent polymer may be prepared by doping a host semiconductor polymer with a small molecular phosphorescent compound. A specific example may include a polymer prepared by doping poly(N-vinylcarbazole) with 1,3-bis[2-(4-tert-butylphenyl)-1,3,4-oxadiazo-5-yl]benzene (OXD-7) and a polymer prepared by doping poly(9,9-dioctylfluorene) with platinum(II) 2,3,7,8,12,13,17,18-octaethyl-21H,23H-porphyrin (PtOEP).

A specific example of the phosphorescent compound includes an iridium-based complex such as Ir(ppy)3 (Tris (2-phenylpyridine)-iridium(III)), Ir(Fppy)3 (Tris(2-(4,6-difluorophenyl)pyridine)iridium(III)), or Ir(DPF)3 (Tris[9,9'-dihexyl-2-(pyridinyl-2')fluorene] iridium), and the like or a platinum-based complex such as PtOEP (Platinum(II) 2,3, 7,8,12,13,17,18-octaethyl-21H,23H-porphyrin).

In addition, the stretchable polymer material may include one or two or more selected from the group consisting of polybutadiene-based rubber, silicone-based rubber, and polyethylene oxide-based rubber. More specifically, the stretchable polymer material may be, for example, polydimethylsiloxane (PDMS), polyethylene oxide (PEO), poly (styrene-butadiene-styrene) block copolymer (SBS), poly (styrene-ethylene-butadiene-styrene) block copolymer (SEBS), and the like.

In addition, the plasticizer material may be a nonionic surfactant, and specifically, may be a PEO-based nonionic surfactant to which an ethylene oxide structural unit is added. Specifically, the plasticizer material may be, for example, triton X-100 (polyoxyethylene octyl phenyl ether), pluronic P123 ((poly(ethylene glycol)-block-poly(propylene glycol)-block-poly(ethylene glycol)), and zonyl FS-300.

Preferably, as the light-emitting material, a light-emitting polymer (fluorescent polymer or phosphorescent polymer) may be selected, and silicone-based rubber or a PEO-based nonionic surfactant may be selected in that excellent stretch may be exhibited when the silicone-based rubber or a PEO-based nonionic surfactant is mixed with the light-emitting polymer.

As a specific example, the light-emitting polymer has a problem in that it is a material having low stretch and being brittle like PEDOT:PSS. However, in an exemplary embodiment according to the present disclosure, the stretchable emission layer may be realized by controlling mechanical properties and assigning stretch by mixing the stretchable polymer material or the plasticizer in the light-emitting polymer.

Meanwhile, the present disclosure may minimize a degradation of the luminescence properties by mixing the light-emitting material and the stretchable polymer material or plasticizer material in a predetermined optimal mass ratio. For example, the light-emitting material and the stretchable polymeric or plasticizer material may be mixed in a mass ratio of 3:1 to 1:3, specifically, in a mass ratio of 2:1 to 1:2, and preferably in a mass ratio of 1:0.9 to 0.9:1.

The polymer blending method and the plasticizer adding method may be performed using a solvent, and here, the solvent is not limited as long as it is able to dissolve each of the light-emitting material and the stretchable polymer material or the plasticizer material. As a specific example, at least one solvent selected from the group consisting of tetrahydrofuran (THF), toluene, chlorobenzene, chloroform, xylene, and 1,2-dichloromethane may be used.

A concentration of the polymer blend solution in which the light-emitting material and the stretchable polymer material or the plasticizer material are mixed may be 0.1 to 100 mg/ml, specifically, 1 to 10 mg, and more specifically 4 to 8 mg/ml.

In the case of the polymer blend solution of the light-emitting polymer and the stretchable polymer material, a temperature for mixing to prepare the solution may be increased to 60 to 80° C., at which the light-emitting polymer and the stretchable polymer material may be mixed, but this is merely an example and the present disclosure is not limited thereto. Meanwhile, in the case of the polymer blend solution of the light-emitting polymer and the plasticizer material, a temperature for mixing to prepare the solution may be room temperature but this is merely an example and the present disclosure is not limited thereto.

As an example, the stretchable EML 220 may be formed by spin-coating the polymer blend solution.

For example, spin-coating for forming the stretchable EML 220 may be performed at 1500 to 4000 rpm and a heat treatment may be performed at a temperature of 80 to 120° C. for 10 to 30 minutes to remove a residual solvent after spin-coating, but the present disclosure is not limited thereto. The stretchable EML 220 from which the solvent was removed is a polymer blend including the light-emitting polymer and may have a microphase-separated structure together with the stretchable polymer material or a plasticizer material included with the light-emitting polymer, specifically, a bicontinuous phase structure. Through the microphase-separated structure, deterioration of light emission characteristics of the light-emitting polymer material may be suppressed.

According to an exemplary embodiment, the stretchable ETL 230 may be formed on the stretchable EML 220 and may include metal oxide nano particles.

For example, the stretchable ETL 230 may be formed by mixing n-type semiconductor metal oxide nano particles and an amine-based polymer material doped with an n-type dopant.

In general, the nano particles are not easily destroyed because stress acting on the material is small even if strain is applied due to structural characteristics thereof like nanowires, and the amine-based polymer may ensure high stretch due to strong hydrogen bonds thereof. Since a structure in which the metal oxide nano particles and the amine-based polymer are stacked on each other is formed, the metal oxide nano particles and the amine-based polymer may have high stretch that is not easily destroyed even in strain through interaction, and due to the high stretch, electron transport characteristics are not substantially deteriorated and the function of the stretchable ETL 230 may be stably performed.

Specifically, the n-type semiconductor metal oxide nano particles may include zinc oxide (ZnO) or titanium dioxide ($TiO_2$). An average particle diameter of the nano particles may be 1 to 500 nm, specifically, 10 to 100 nm.

The metal oxide nano particles may be dispersed in a polar solvent so as to be prepared, and here, the solvent may be an alcohol. A specific example of the alcohol solvent may include at least one of ethanol, isopropyl alcohol, 2-ethoxy ethanol, and 2-methoxy ethanol. A concentration of nano particles in the solution may be 0.1 to 10 wt %, specifically 1 to 5 w %, and more specifically 2 to 4 w %.

The metal oxide nano particles may be formed by spin-coating on the stretchable EML 220, and the spin-coating may be performed at 1000 to 3000 rpm. In addition, a heat treatment may be performed for 10 to 30 minutes at a temperature of 80 to 120° C. to remove a residual solvent after spin-coating, from which the stretchable ETL including the metal oxide nano particles may be formed on the stretchable EML 220.

Meanwhile, the amine-based polymer material may include at least one selected from the group consisting of polyethyleneimine (PEI), polyethyleneimine ethoxylated (PEIE), and poly [(9,9-bis(3'-(N,N-dimethylamino)propyl)-2,7-fluorene)-alt-2,7-(9,9-dioctylfluorene)] (PFN).

In addition, the amine-based polymer material may be doped with an n-type dopant to improve electron transport characteristics, and the n-type dopant may include at least one of cesium carbonate ($CsCO_3$), an organic compound (tris(8-hydroxyquinolinato)aluminum $Al(C_9H_6NO)^3$ (Alq3)), cesium fluoride (CsF).

The solution of the doped amine-based polymer material may be dispersed in a polar solvent so as to be prepared, and here, the solvent may be an alcohol. As a specific example of the alcohol solvent, at least one of ethanol, isopropyl alcohol, 2-ethoxy ethanol and 2-methoxy ethanol may be used. A concentration of the amine-based polymer material in the solution may be 1.0 to 2.5 wt %.

In addition, the amine-based polymer material and the n-type dopant may be mixed in a 10:1 to 30:1 wt % so that the amine-based polymer material may be preferably doped with the n-type dopant.

The doped amine-based polymer material may be formed on the oxide nano particle layer through spin-coating, and spin-coating may be performed at 1000 to 5000 rpm. In addition, a heat treatment may be performed for 10 to 30 minutes at a temperature of 80 to 120° C. to remove a residual solvent after spin-coating.

Through the process as described above, the metal oxide nano particle layer and the amine-based polymer material layer doped with the n-type dopant may be stacked on the stretchable EML 220 to form the stretchable ETL.

As an example, the stretchable anode 240 may be formed on the stretchable ETL 230 and may include a nano-wire material.

For example, the stretchable anode 240 may be formed on the amine-based polymer material and may include at least one material of silver nano-wires, copper nano-wires, PEDOT:PSS, and CNTs. Preferably, the stretchable anode 240 may include a silver nano-wire material.

Specifically, the silver nano-wires of the stretchable anode 240 are nano-wires having a diameter of tens of nm and a length of tens to hundreds of um, and as several nano-wires have a mesh structure, the stretchable anodes 240 may exhibit electrical conductivity. The stretchable anode 240 may ensure high mechanical stability as stress applied to the material is dispersed through the nano-wires having the mesh structure when strain is applied, compared to a silver thin film.

Specifically, the silver nano-wires of the stretchable anode 240 may be dispersed in a solvent at a concentration of 1 to 10 mg/ml, preferably, at a concentration of 2 to 5 mg/ml. The solvent may be an alcoholic solvent and may include, specifically, at least one of ethanol and isopropyl alcohol.

In addition, the stretchable anode 240 may be formed on the stretchable ETL 230 using the silver nano-wire dispersed solution through spin-coating or spray coating and a heat-treatment may be performed thereon for 10 to 30 minutes at a temperature of 90 to 120° C. to remove a residual solvent after the coating.

Meanwhile, the stretchable light emitting part 200 according to an exemplary embodiment may further include an upper ETL on the stretchable anode 240 in order to reduce a leakage current and increase electrical stability, and the same material used for the stretchable ETL 230 may also be used as a material of the upper ETL.

As an example, the metal oxide nano particle layer provided in the upper ETL may be formed on the stretchable anode 240 through spin-coating, and here, the spin-coating may be performed at 1000 to 3000 rpm.

In addition, a heat treatment may be performed for 10 to 30 minutes at a temperature of 80 to 120° C. to remove a residual solvent after spin-coating to form the nano particle layer provided on the upper ETL.

The amine-based polymer material doped with the n-type dopant provided in the upper ETL may be formed on the nano particle layer provided in the upper ETL by spin-coating, and the spin-coating may be performed at 3000 to 5000 rpm.

In addition, a heat treatment may be performed for 10 to 30 minutes at a temperature of 80 to 120° C. to remove a residual solvent after spin-coating to form the doped amine-based polymer material provided in the upper ETL.

Figure 4:
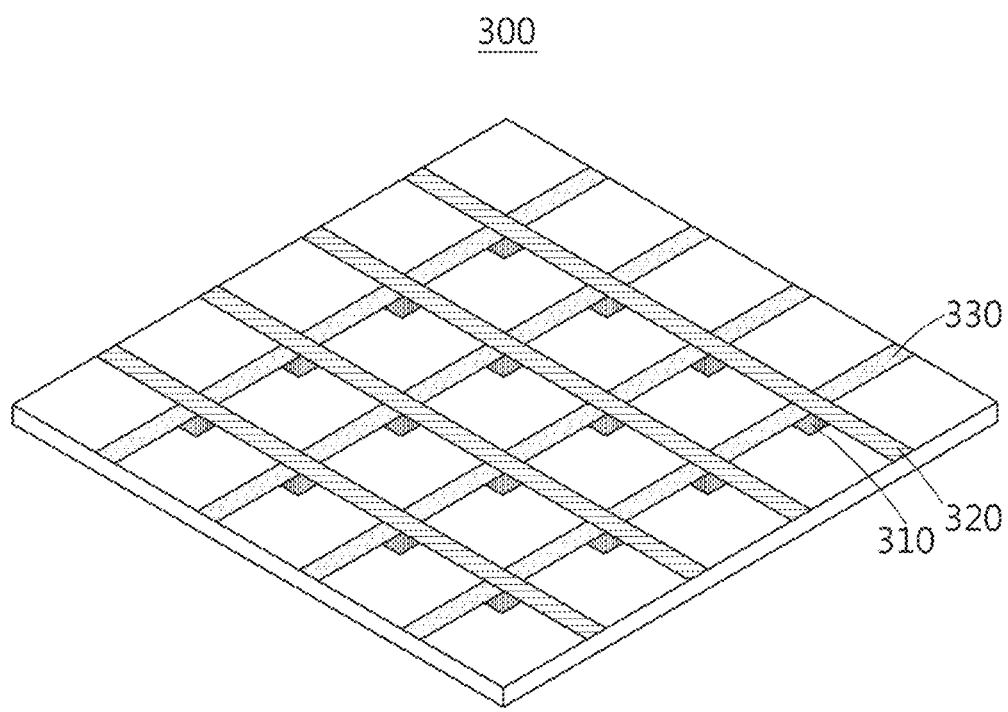
FIG. 4 is a view illustrating an example of the stretchable driving part according to an exemplary embodiment.

FIG. 4 is a view illustrating an example of a stretchable driving part according to an exemplary embodiment.

Referring to FIG. 4, a stretchable driving part 300 may include a stretchable FET 310, a stretchable bit line 320, and a stretchable anode 330 and control an ON/OFF operation of each pixel of the stretchable light emitting part described above with reference to FIGS. 1 and 2.

Specifically, the stretchable FET 310 may include a source electrode, a drain electrode, and a gate electrode formed of at least one material among carbon nano-tube (CNT) and nano-wires, a channel material formed of CNT or semiconductor polymer exhibiting semiconductor properties, and a gate dielectric layer formed of a stretchable polymer.

For example, the semiconductor polymer configuring the channel material may include any one or two or more selected from the group consisting of poly (3-hexylthiophene) (P3HT), pentacene, MEH-PPV, and polyaniline.

In addition, the gate dielectric layer may be a stretchable polymer material and include at least one of, specifically, polydimethyl siloxane (PDMS), polyethylene oxide (PEO), poly(styrene-butadiene-styrene) block copolymer (SBS), poly(styrene-ethylene-butadiene-styrene) block copolymer (SEBS), and polyurethane (PU).

Meanwhile, the stretchable anode 330 may be formed of the same material and method as the stretchable cathode described above with reference to FIG. 3.

Figure 5:
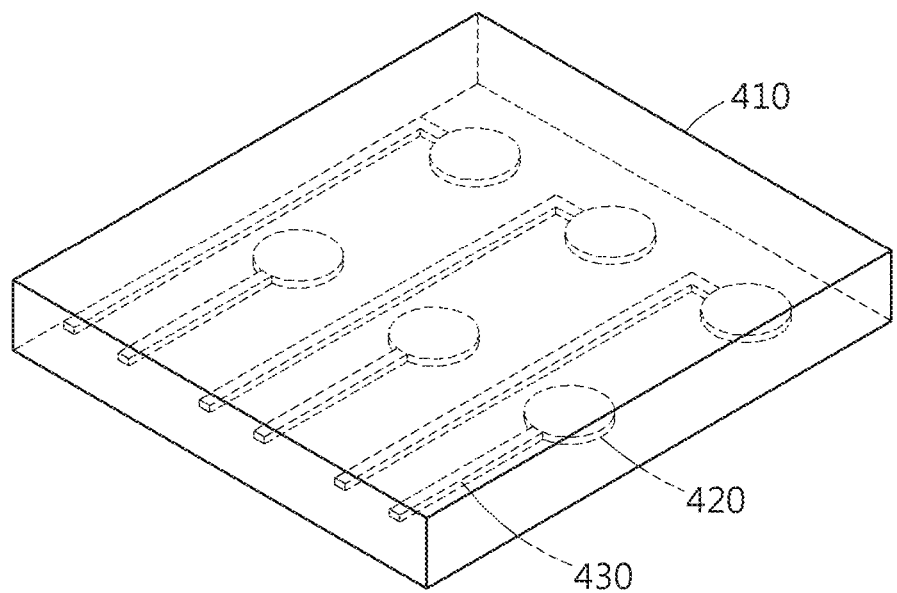
FIG. 5 is a view illustrating an example of a stretchable actuator according to an exemplary embodiment.
Figure 6:
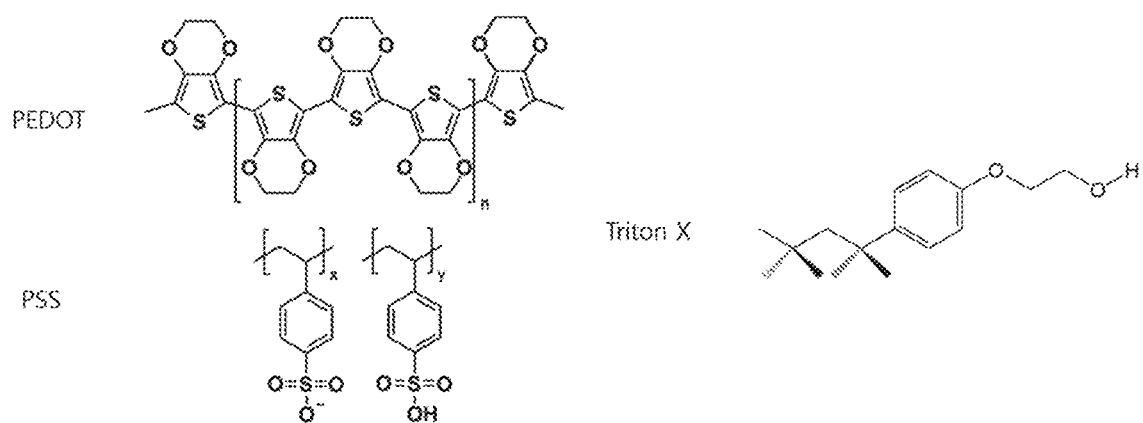
FIGS. 6 through 8 are views illustrating an example of a material for forming a stretchable light emitting part according to an exemplary embodiment.
Figure 7:
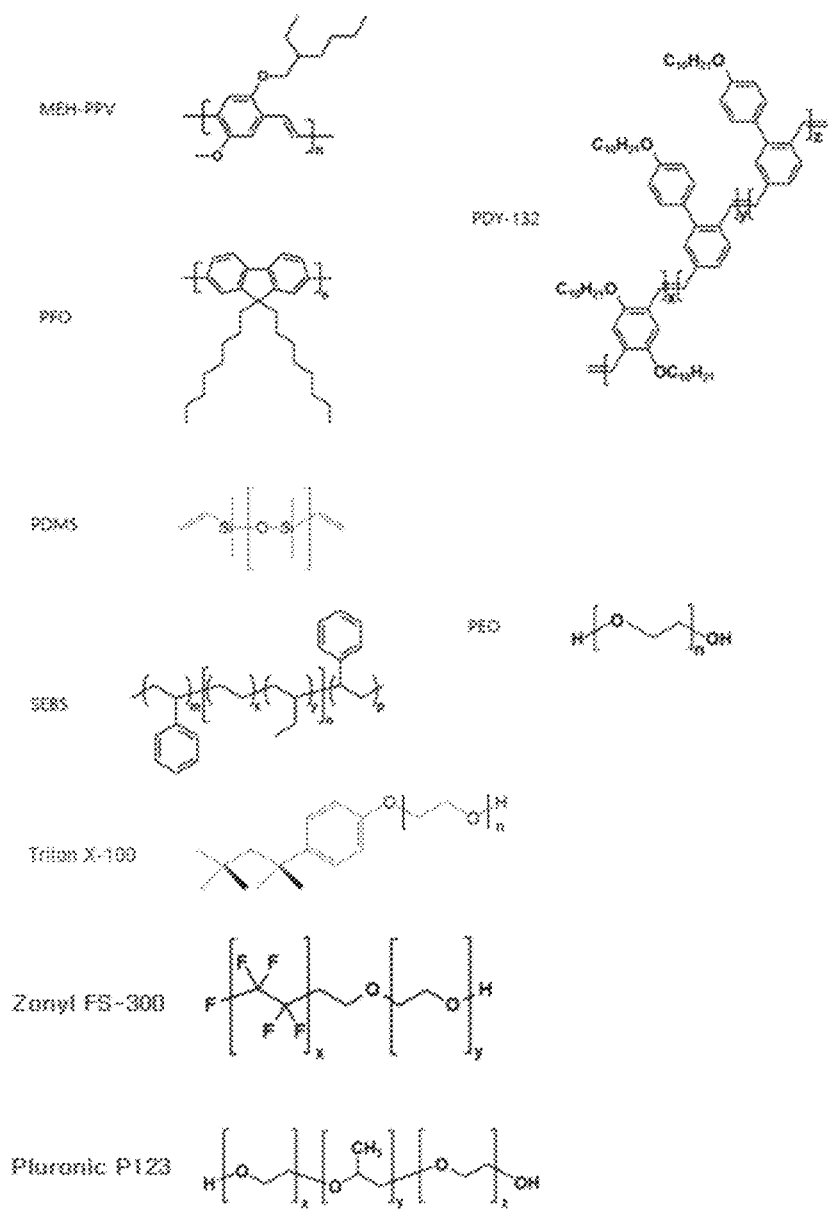
Figure 8:
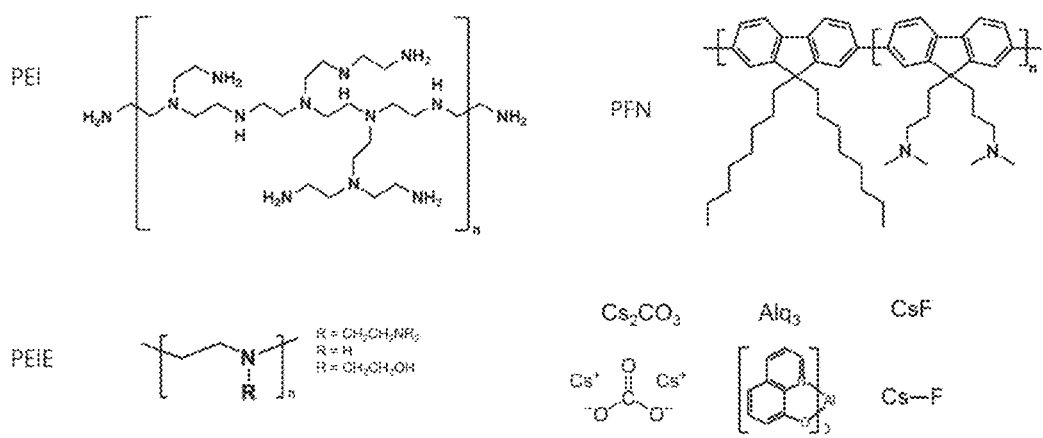

FIG. 5 is a view illustrating an example of a stretchable actuator according to an exemplary embodiment.

Referring to FIG. 5, the stretchable actuator 400 may include a driving layer 410 formed of silicone-based rubber.

In addition, the stretchable actuator 400 may further include at least one pneumatic chamber 420 and at least one microchannel 430 respectively corresponding to the at least one pneumatic chamber 420 formed in the driving layer 410 to control 3D deformation of a shape of the stretchable light emitting part described above with reference to FIGS. 1 to 5.

For example, the pneumatic chamber 420 and the microchannel 430 may be formed through laser patterning or a molding method using a silicon mold.

That is, the stretchable actuator 400 according to an exemplary embodiment may control an actuation operation of each of the corresponding pneumatic chamber 420 through each of the micro-channel 430 and may realize surface texture and a 3D stereoscopic image through the actuation operation of each of the pneumatic chamber 420.

A second aspect of the present disclosure relates to a method of manufacturing a 3D tactile display apparatus, including forming a stretchable actuator including a driving layer of transparent rubber, forming a stretchable driving part including a stretchable field effect transistor (FET) on the stretchable actuator, and forming a stretchable light emitting part including a stretchable material on the stretchable driving part.

Figure 9:
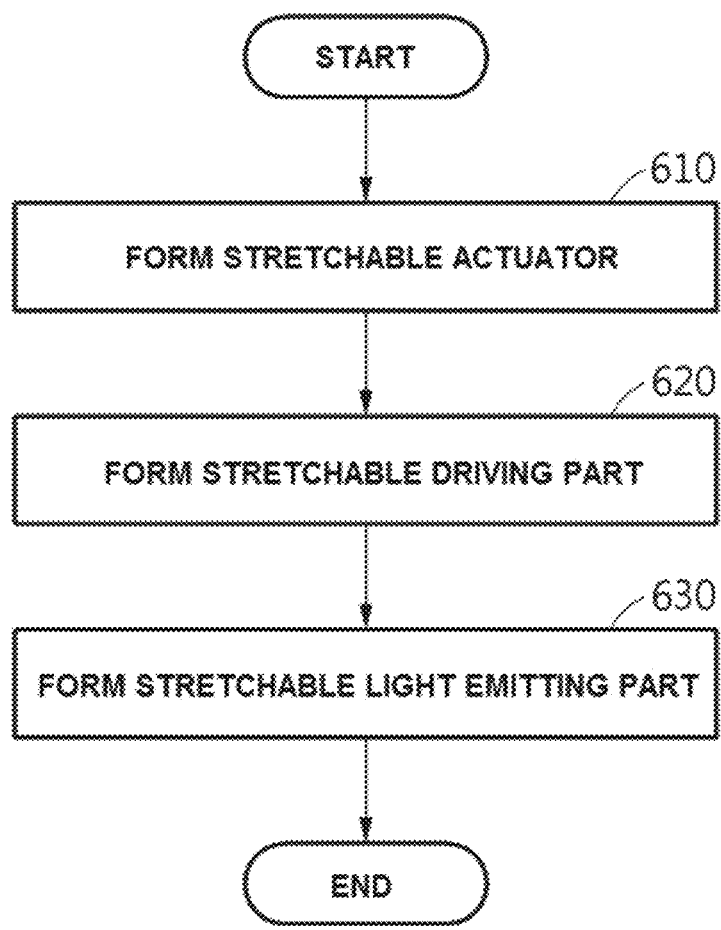
FIG. 9 is a view illustrating a method of manufacturing a 3D tactile display apparatus according to an exemplary embodiment.

FIG. 9 is a view illustrating a method of manufacturing a 3D tactile display apparatus according to an exemplary embodiment.

In other words, FIG. 9 is a view illustrating a method of manufacturing a 3D tactile display apparatus according to an exemplary embodiment described above with reference to FIGS. 1 to 8, and hereinafter, the descriptions of the same contents described through FIG. 9 as the contents described above through the 3D tactile display apparatus according to an exemplary embodiment will be omitted.

Referring to FIG. 9, in the method of manufacturing a 3D tactile display apparatus according to an exemplary embodiment, in operation 610, a stretchable actuator including a driving layer of transparent rubber may be formed.

In the method of manufacturing a 3D tactile display apparatus according to an exemplary embodiment, in operation 610, a pneumatic chamber and a micro-channel may be formed and a driving layer may be formed on the pneumatic chamber and the micro-channel.

That is, the stretchable actuator according to an exemplary embodiment may control an actuation operation of each of corresponding pneumatic chambers through the micro-channels, and surface texture and a 3D stereoscopic image may be realized through an actuation operation of each of the pneumatic chambers.

Thereafter, in the method of manufacturing the 3D tactile display apparatus according to the exemplary embodiment, in operation 620, a stretchable driving part including a stretchable FET may be formed on the stretchable actuator.

As an example, the method of manufacturing a 3D tactile display apparatus according to an exemplary embodiment in operation 620 may include forming a stretchable substrate to form a stretchable FET, forming a source electrode and a drain electrode on the stretchable substrate, forming a semiconductor channel, forming a gate dielectric layer, and forming a gate electrode.

For example, each layer configuring the stretchable FET may be formed through at least one method among spin-coating, ink-jet printing, and slot die coating.

The stretchable FET may also be formed of at least one material among carbon nano-tube (CNT) and silver nano-wires (AgNW).

Thereafter, in the manufacturing method of the 3D tactile display apparatus according to an exemplary embodiment, in operation 630, a stretchable light emitting part including a stretchable material may be formed on the stretchable driving part.

As an example, in the method of manufacturing a 3D tactile display apparatus according to an exemplary embodiment, in operation 630, a stretchable HTL including a conductive polymer material may be formed and a stretchable EML including the light-emitting material may be formed on the stretchable HTL.

In addition, in the method of manufacturing a 3D tactile display apparatus according to an exemplary embodiment, in operation 630, a stretchable ETL including nano particles may be formed on the stretchable EML, and a stretchable cathode including a nano-wire material may be formed on the stretchable ETL.

Specifically, in the method for manufacturing a 3D tactile display apparatus according to an exemplary embodiment, in operation 630, a non-ionic surfactant having a predetermined optimal mass ratio may be added to a solution including a conductive polymer material to change a structure of a conductive polymer material into a nano-fiber structure to form the stretchable HTL.

In a specific example, in the method of manufacturing a 3D tactile display apparatus according to an exemplary embodiment, in operation 630, the structure of PEDOT:PSS may be changed into the nano-fiber form by adding Triton X-100 which is a non-ionic surfactant to the PEDOT:PSS solution.

In addition, in operation 630, the method of manufacturing the 3D tactile display apparatus according to the exemplary embodiment may use at least one of a polymer blending method and a plasticizer adding method. Through this, in operation 630, a stretchable EML including a light-emitting material and one or a combination of two selected from the group consisting of a stretchable polymer material and a plasticizer may be formed.

In addition, in the method for manufacturing a 3D tactile display apparatus according to an exemplary embodiment, in operation 630, a stretchable ETL may be formed by mixing n-type semiconductor metal oxide nano particles and an amine-based polymer material doped with an n-type dopant.

The metal oxide nano particles may be dispersed in a polar solvent so as to be prepared, and the metal oxide nano particle polar solvent dispersion solution is spin-coated and heat-treated to form a metal oxide nano particle layer on the stretchable EML 220.

In addition, a solution is prepared by dispersing an amine-based polymer material doped with an n-type dopant in a polar solvent, and the solution is spin-coated and heat-treated to form a stretchable ETL having a structure in which the metal oxide nano particle layer and the amine-based polymer material layer doped with the n-type dopant are stacked, on the metal oxide nano particle layer.

The nano particles are not easily destroyed because stress acting on the material is small even if strain is applied due to structural characteristics thereof like nano-wires, and the amine-based polymer may ensure high stretch due to strong hydrogen bonds thereof. Since the structure in which the metal oxide nano particle layer and the amine-based polymer material layer doped with the n-type dopant are stacked is formed as described above, the metal oxide nano particles and the amine-based polymer may have high stretch not easily destroyed even in strain through interaction, and due to the high stretch, electron transport characteristics are not substantially deteriorated and the function of the stretchable ETL 230 may be stably performed.

A third aspect of the present disclosure relates to an OLED including a stretchable driving part including a stretchable field effect transistor (FET) and a stretchable light emitting part including a stretchable material on the stretchable driving part.

As an example, the stretchable light emitting part may include a stretchable hole transport layer (HTL) including a conductive polymer material, a stretchable emission layer (EML) formed on the stretchable HTL and including a light-emitting material, a stretchable electron transport layer (ETL) formed on the stretchable EML and including metal oxide nano particles, and a stretchable cathode formed on the stretchable ETL and including a nano-wire material.

As an example, the stretchable HTL may include a nonionic surfactant and a conductive polymer nano-fiber.

As an example, the stretchable EML may include one or a combination of two selected from the group consisting of a stretchable polymer material and a plasticizer and a light-emitting material.

The stretchable HTL, the stretchable EML, the stretchable ETL, and the stretchable cathode have been described in detail in the first aspect and the second aspect, and thus, a detailed description thereof will be omitted. In addition, various limitations and modifications of the OLED according to the present disclosure may include the contents of the various examples described in the stretchable driving part and the stretchable light emitting part included in the 3D tactile display apparatus as is.

According to the present disclosure, the OLED capable of realizing a stretchable image by realizing the stretchable light emitting part in which the HTL, the EML, the ETL, and the cathode are all formed of a stretchable material. Furthermore, the 3D tactile display apparatus capable of minimizing a degradation of characteristics of the display device, while realizing a 3D stereoscopic image, by assigning texture to the display surface by combining the stretchable light emitting part and the stretchable actuator is provided.

In addition, according to the present disclosure, the method of manufacturing a stretchable OLED and a 3D tactile display apparatus which enable a solution process and have a large area at a low voltage may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

DETAILED DESCRIPTION OF MAIN ELEMENTS

120: 3D tactile display apparatus
121: stretchable actuator
122: stretchable driving part
123: stretchable light emitting part
210: stretchable HTL
220: stretchable EML
230: stretchable ETL
240: stretchable cathode
310: stretchable FET
320: stretchable bit line
330: stretchable anode
410: driving layer
420: pneumatic chamber
430: micro-channel

What is claimed is:

1. A three-dimensional (3D) tactile display apparatus comprising:
   a stretchable actuator including a driving layer formed of transparent rubber;
   a stretchable driving part including a stretchable field effect transistor (FET) on the stretchable actuator; and
   a stretchable light emitting part including a stretchable material on the stretchable driving part.

2. The 3D tactile display apparatus of claim 1, wherein the stretchable light emitting part comprises:
   a stretchable hole transport layer (HTL) including a conductive polymer material;
   a stretchable emission layer (EML) formed on the stretchable HTL and including a light-emitting material;
   a stretchable electron transport layer (ETL) formed on the stretchable EML and including metal oxide nano particles; and
   a stretchable cathode formed on the stretchable ETL and including a nano-wire material.

3. The 3D tactile display apparatus of claim 2, wherein the stretchable HTL comprises a nonionic surfactant and a conductive polymer nano-fiber.

4. The 3D tactile display apparatus of claim 2, wherein the stretchable EML comprises one or a combination of two selected from the group consisting of a stretchable polymer material and a plasticizer and a light-emitting material.

5. The 3D tactile display apparatus of claim 4, wherein the light-emitting material comprises one or two or more selected from the group consisting of a fluorescent polymer, a fluorescent compound, a phosphorescent polymer, and a phosphorescent compound, the stretchable polymer material comprises one or two or more selected from the group consisting of polybutadiene-based rubber, silicone-based rubber, and polyethylene oxide-based rubber, and the plasticizer is a nonionic surfactant.

6. The 3D tactile display apparatus of claim 2, wherein the stretchable ETL comprises n-type semiconductor metal oxide nano particles and an amine-based polymer material doped with an n-type dopant.

7. The 3D tactile display apparatus of claim 1, wherein the stretchable driving part comprises the stretchable FET, a stretchable bit-line, and a stretchable anode and control an ON/OFF operation of each pixel of the stretchable light emitting part.

8. The 3D tactile display apparatus of claim 1, wherein the stretchable actuator further comprises a pneumatic chamber and a micro-channel formed in the driving layer to control 3D deformation of a shape of the stretchable light emitting part.

9. A method of manufacturing a three-dimensional (3D) tactile display apparatus, the method comprising:
   forming a stretchable actuator including a driving layer of transparent rubber;
   forming a stretchable driving part including a field effect transistor (FET) on the stretchable actuator; and
   forming a stretchable light emitting part including a stretchable material on the stretchable driving part.

10. The method of claim 9, wherein the forming of the stretchable light emitting part comprises:
    forming a stretchable hole transport layer (HTL) including a conductive polymer material;
    forming a stretchable emission layer (EML) including a light-emitting material on the stretchable HTL;
    forming a stretchable electron transport layer (ETL) including metal oxide nano particles on the stretchable EML; and
    forming a stretchable cathode including a nano-wire material on the stretchable ETL.

11. The method of claim 10, wherein the forming of the stretchable HTL comprises changing a structure of the conductive polymer material into a nano-fiber structure by adding a non-ionic surfactant having a predetermined mass ratio to a solution containing the conductive polymer material.

12. The method of claim 10, wherein the forming of the stretchable EML comprises forming the stretchable EML by mixing one or two materials selected from the group consisting of a stretchable polymer material and a plasticizer with the light-emitting material.

13. The method of claim 10, wherein the forming of the stretchable ETL comprises forming the stretchable ETL by mixing n-type semiconductor metal oxide nano particles with an amine-based polymer material doped with an n-type dopant.

14. The method of claim 9, wherein the forming of the stretchable actuator comprises forming a pneumatic chamber and a micro-channel and forming the driving layer on the pneumatic chamber and the micro-channel.

15. A stretchable organic light emitting diode (OLED) comprising:
a stretchable driving part including a stretchable field effect transistor (FET); and
a stretchable light emitting part including a stretchable material on the stretchable driving part;
wherein the stretchable light emitting part comprises, a stretchable hole transport layer (HTL) including a conductive polymer material,
a stretchable emission layer (EML) formed on the stretchable HTL and including a light-emitting material,
a stretchable electron transport layer (ETL) formed on the stretchable EML and including metal oxide nano particles and
a stretchable cathode formed on the stretchable ETL and including a nano-wire material,
wherein the stretchable HTL comprises a nonionic surfactant and a conductive polymer nano-fiber.

16. The stretchable OLED of claim 15, wherein the stretchable EML comprises one or a combination of two selected from the group consisting of a stretchable polymer material and a plasticizer and a light-emitting material.

* * * * *